(12) United States Patent
Mattisson et al.

(10) Patent No.: US 7,904,036 B2
(45) Date of Patent: Mar. 8, 2011

(54) MODULATION METHOD AND APPARATUS

(75) Inventors: Sven Mattisson, Bjärred (SE); Magnus Nilsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 833 days.

(21) Appl. No.: 11/292,488

(22) Filed: Dec. 2, 2005

(65) Prior Publication Data
US 2007/0126500 A1    Jun. 7, 2007

(51) Int. Cl.
*H01Q 11/12* (2006.01)
*H04B 1/04* (2006.01)
*H03F 3/38* (2006.01)

(52) U.S. Cl. ............ 455/118; 455/102; 455/196.1; 455/209; 455/258; 455/316; 330/10

(58) Field of Classification Search ........... 455/118, 455/91, 119, 123–125, 323, 326, 255–259, 455/264–265, 296, 313, 315–318, 285, 192.1–192.2, 455/283, 302, 333–334, 102–103, 107, 115.1, 455/196.1, 195.1, 208–209; 330/253–254, 330/10; 327/113, 254, 359
See application file for complete search history.

(56) References Cited

U.S. PATENT DOCUMENTS

| | | | | |
|---|---|---|---|---|
| 4,412,141 | A * | 10/1983 | Jacobsen | 327/532 |
| 5,838,210 | A | 11/1998 | Midya et al. | |
| 5,894,592 | A | 4/1999 | Brueske et al. | |
| 6,205,325 | B1 * | 3/2001 | Groe | 455/333 |
| 6,300,845 | B1 * | 10/2001 | Zou | 332/178 |
| 6,385,439 | B1 | 5/2002 | Hellberg | |
| 6,711,397 | B1 | 3/2004 | Petrov et al. | |
| 6,763,227 | B2 * | 7/2004 | Kramer | 455/115.1 |
| 6,778,117 | B1 * | 8/2004 | Johnson | 341/144 |
| 6,806,693 | B1 | 10/2004 | Bron | |
| 6,865,382 | B2 * | 3/2005 | Behzad | 455/323 |
| 6,937,849 | B2 * | 8/2005 | Kluge et al. | 455/333 |

(Continued)

FOREIGN PATENT DOCUMENTS

EP   0276130   7/1988

(Continued)

OTHER PUBLICATIONS

Klumperink, E. A. M., "A CMOS Switched Transconductor Mixer". IEEE Journal of Solid—State Circuits. Aug. 2004. 1231-1240. vol. 39; No. 8.

*Primary Examiner* — Pablo N Tran
(74) *Attorney, Agent, or Firm* — Coats & Bennett, P.L.L.C.

(57) ABSTRACT

A modulation circuit for use in a radiofrequency transmitter includes a local oscillator circuit configured to generate one or more local oscillator signals at a desired frequency and with a duty cycle at or about twenty-five percent, and a modulator configured to generate one or more modulated signals responsive to the one or more local oscillator signals and one or more baseband information signals. In at least one embodiment, the modulation circuit includes a modulator comprising a combined mixing and transconductance circuit that includes a transistor circuit for each baseband information signal serving as a modulation input to the modulator. Each transistor circuit comprises a first transistor driven by the baseband information signal and coupling a modulator output node to a corresponding transconductance element, and a second transistor driven by one of the one or more local oscillator signals and coupling the corresponding transconductance element to a signal ground node.

5 Claims, 9 Drawing Sheets

U.S. PATENT DOCUMENTS

| | | | |
|---|---|---|---|
| 7,062,248 B2 * | 6/2006 | Kuiri | 455/334 |
| 7,088,980 B2 * | 8/2006 | Otaka | 455/323 |
| 7,088,982 B1 * | 8/2006 | Chien | 455/326 |
| 7,177,620 B1 * | 2/2007 | Tsai et al. | 455/333 |
| 7,263,344 B2 * | 8/2007 | Manku | 455/323 |
| 7,266,357 B2 * | 9/2007 | Behzad | 455/285 |
| 7,274,253 B2 * | 9/2007 | Pan | 330/51 |
| 7,392,026 B2 * | 6/2008 | Alam et al. | 455/180.1 |
| 7,425,995 B2 * | 9/2008 | Johnson | 348/725 |
| 7,457,606 B2 * | 11/2008 | Kim | 455/323 |
| 2001/0016016 A1 | 8/2001 | Eidson et al. | |
| 2003/0007377 A1 * | 1/2003 | Otaka | 363/127 |
| 2003/0087614 A1 * | 5/2003 | Kramer | 455/112 |
| 2003/0117222 A1 | 6/2003 | Anderson | |
| 2005/0239430 A1 | 10/2005 | Shah | |
| 2007/0042728 A1 * | 2/2007 | Pan | 455/127.1 |
| 2007/0087711 A1 * | 4/2007 | Pan | 455/127.4 |
| 2008/0007339 A1 * | 1/2008 | Pan | 330/253 |

FOREIGN PATENT DOCUMENTS

| | | |
|---|---|---|
| EP | 0896424 | 2/1999 |
| EP | 0909052 | 4/1999 |

* cited by examiner

MODULATION METHOD AND APPARATUS

BACKGROUND OF THE INVENTION

The present invention generally relates to signal modulation, such as for radiofrequency signal generation, and particular relates to modulation waveforms and corresponding modulation circuits.

Transmitters used in communication devices and systems commonly employ modulation circuits to up-convert baseband information signals to a desired (carrier) frequency. More particularly, such devices and systems impose transmit information on carrier signals, which usually are generated at desired or assigned transmit channel frequencies, by modulating carrier signal phase, frequency, amplitude, or some combination thereof, according to one or more baseband information signals representing the desired transmit information.

Quadrature modulation, also referred to as "IQ" modulation, uses two carrier signals, an in-phase carrier and quadrature carrier that is offset from the in-phase carrier by 90 degrees. The two carriers generally are modulated by corresponding in-phase and quadrature baseband information signals and then combined for amplification and transmission over a communication channel. IQ modulation finds widespread use in a variety of wireless communication systems, such as in cellular communication networks based on Wideband Code Division Multiple Access (WCDMA) or cdma2000 standards.

SUMMARY OF THE INVENTION

According to the methods and apparatus taught herein, one embodiment of a modulation circuit comprises a local oscillator circuit configured to generate one or more local oscillator signals at a desired frequency and with a duty cycle at or about twenty-five percent, and a modulator configured to generate one or more modulated signals responsive to the one or more local oscillator signals and one or more baseband information signals. The modulation circuit may be used, for example, in a wireless communication device, such as a cellular radiotelephone.

In one embodiment, the modulator comprises a transconductance stage circuit configured to generate one or more current signals responsive to the one or more baseband information signals, and a mixer stage circuit configured to generate one or more mixer output signals responsive to the one or more current signals and the one or more local oscillator signals. In another embodiment, the mixer stage circuit and the transconductance stage circuit are effectively combined. The resulting modulator configuration offers a number of advantages, which, by way of non-limiting example, include reduced drive amplitude requirements and improved output voltage swing.

One embodiment of the above-described combined mixing and transconductance circuit includes a transistor circuit for each baseband information signal serving as a modulation input to the modulator. Each such transistor circuit comprises a first transistor driven by the baseband information signal and coupling a modulator output node to a corresponding transconductance element, and a second transistor driven by one of the one or more local oscillator signals and coupling the corresponding transconductance element to a signal ground or reference node.

With these modulator variations in mind, one embodiment of a method of improving modulator operation is based on generating local oscillator signals at or about a twenty-five percent duty cycle. One such method comprises generating one or more local oscillator signals at the desired frequency and with a duty cycle of at or about twenty-five percent, and driving corresponding local oscillator signal inputs of a modulator with the one or more local oscillator signals. The modulator may employ separate transconductance and mixing stage circuits, or may employ a combined mixing and transconductance stage circuit.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
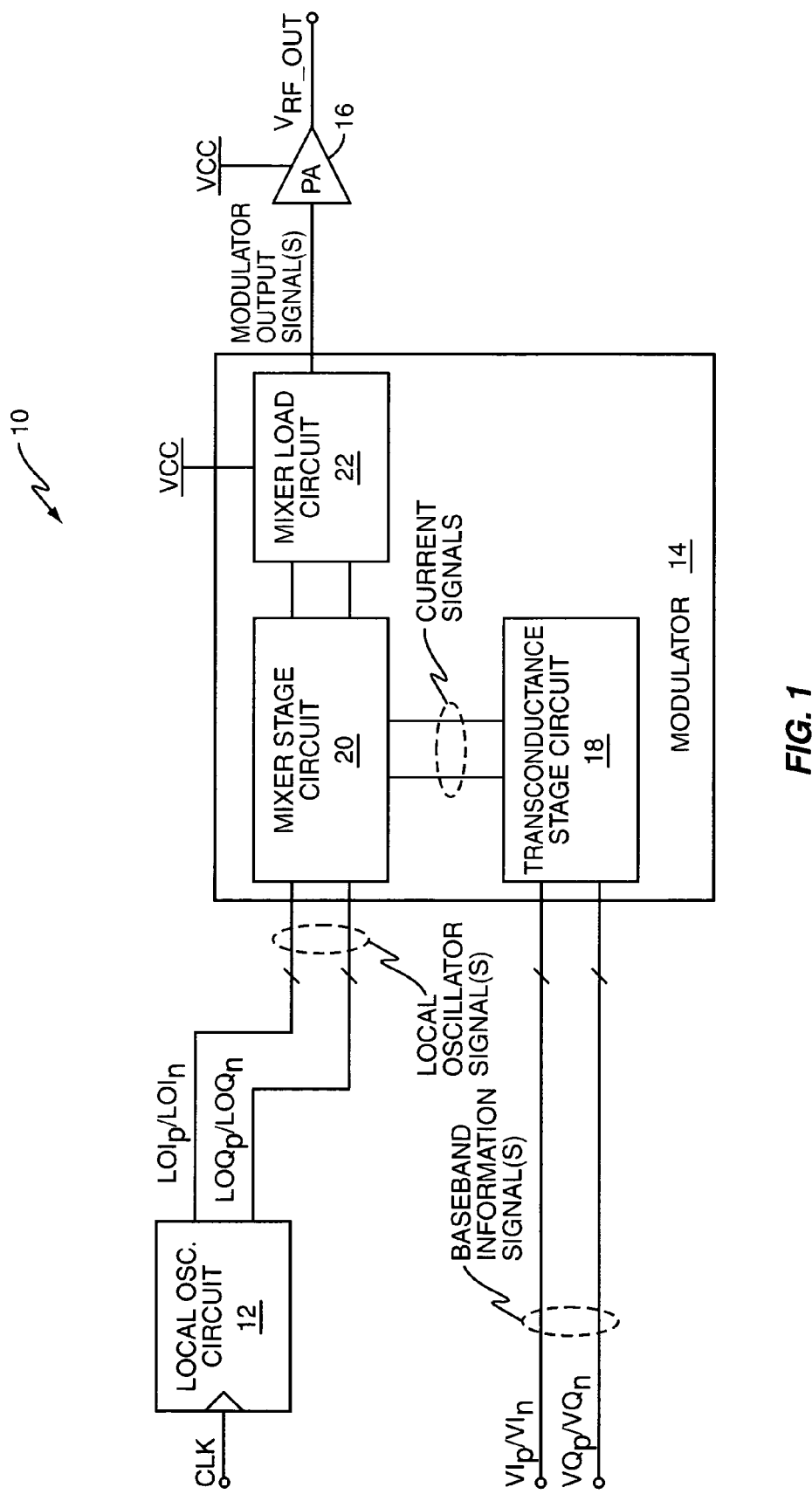
FIG. 1 is a block diagram of one embodiment of a modulation circuit.

FIG. 1 illustrates one embodiment of a modulation circuit 10, such as might be implemented in a wireless communication device or system. In the illustrated embodiment, the modulation circuit 10 includes or is associated with a local oscillator circuit 12 that is configured to generate one or more local oscillator signals at a desired frequency and with a duty cycle at or about twenty-five percent (as compared to the conventional fifty percent duty cycle used for such signals). The modulation circuit 10 further includes a modulator 14, which is configured to generate one or more modulated signals responsive to the one or more local oscillator signals and one or more baseband information signals. In the diagram, the modulated signals, i.e., the modulated carrier signal(s) output by the modulator 14, are labeled as "modulator output signal(s)," and may comprise a single-ended mixer output signal or a differential pair of mixer output signals. In any case, the modulator output signal is input to a power amplifier (PA) circuit 16 that is configured to amplify it for transmission.

In looking at the modulator 14 in more detail, one sees that the illustrated modulator embodiment comprises a transconductance stage circuit 18 that is configured to generate one or more (differential) current signals responsive to the one or more baseband information signals, and further comprises a mixer stage circuit 20 that is configured to generate one or more mixer output signals responsive to the one or more current signals and the one or more local oscillator signals. Note that the mixer output signals are generated by the mixer stage circuit 20 via a mixer load circuit 22, embodiments of which are detailed later herein.

Further, note that the one or more baseband information signals are depicted as differential pairs of in-phase and quadrature signals, labeled VIp/VIn to denoted the positive and negative or complementary signal components. Likewise, the one or more local oscillator signals are depicted as differential pairs of in-phase and quadrature local oscillator signals, labeled LOIp/LOIn, for the in-phase component, and labeled LOQp/LOQn, for the quadrature component.

Figure 2:
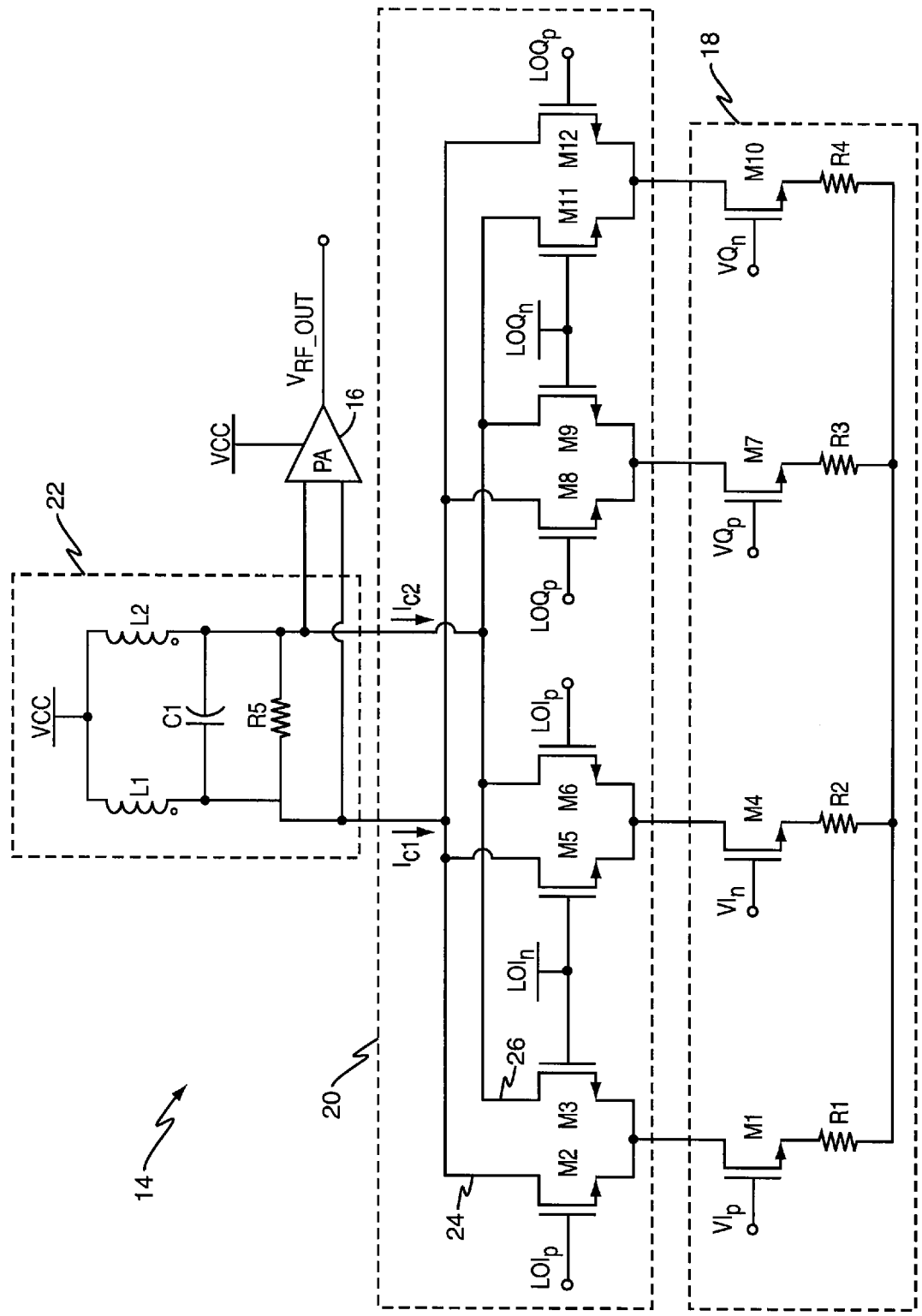
FIG. 2 is a schematic diagram of one embodiment of the modulator illustrated in the modulation circuit of FIG. 1.

FIG. 2 provides a schematic illustration for one embodiment of the modulator 14 shown in FIG. 1. In particular, the illustrated circuit arrangement is adapted for the differential pairs of in-phase and quadrature baseband and local oscillator signals described above, and thus comprises two double-balanced mixers, wherein the mixer output currents (Ic1 and Ic2) are added in the load.

In more detail, one sees that the transconductance stage circuit 18 comprises a transistor M1 driven by one component of the differential baseband information signal pair VIp/VIn. The transistor M1, which is associated with a corresponding transconductance element (shown as R1), converts the input baseband information signal into a current-mode signal coupled to the M2/M3 transistor pair of the mixer stage circuit 20. The M2/M3 transistor pair is driven by the differential local oscillator signal pair LOIp/LOIn. The other component of the VIp/VIn differential pair drives a transistor M4, which similarly is associated with a corresponding transconductance element (R2), and the M5/M6 transistor pair in the mixer stage circuit 20.

With this arrangement, the differential current modulation generated from the VIp/VIn baseband information signals are up-converted by the M2/M3 and M5/M6 transistor pairs of the mixer stage circuit 20 to the frequency of the local oscillator signal LOIp/LOIn. A similar arrangement and operation applies for quadrature baseband information signal VQp/VQn and the quadrature local oscillator signal LOQp/LOQn, via the transistors M7 and M10, and their corresponding transconductance elements R3 and R4, and their corresponding mixer stage transistor pairs M8/M9 and M11/M12.

Such operation produces a differential current Ic1 and Ic2 representing a carrier frequency signal having modulations corresponding to the baseband information signals VIp/VIn and VQp/VQn. The differential current drives the mixer load circuit 22, which, in the illustrated embodiment, comprises the inductors L1 and L2, a capacitor C1, and a resistor R5. By operation of the mixer load circuit 22, the differential current Ic1 and Ic2 produce a voltage-mode, modulated carrier signal at the input of the power amplifier 16, which amplifies it for transmission. Note, too, that the mixer load circuit 22 generally is resonantly tuned to suppress harmonics of the local oscillator frequency, $f_{LO}$.

Figure 3:
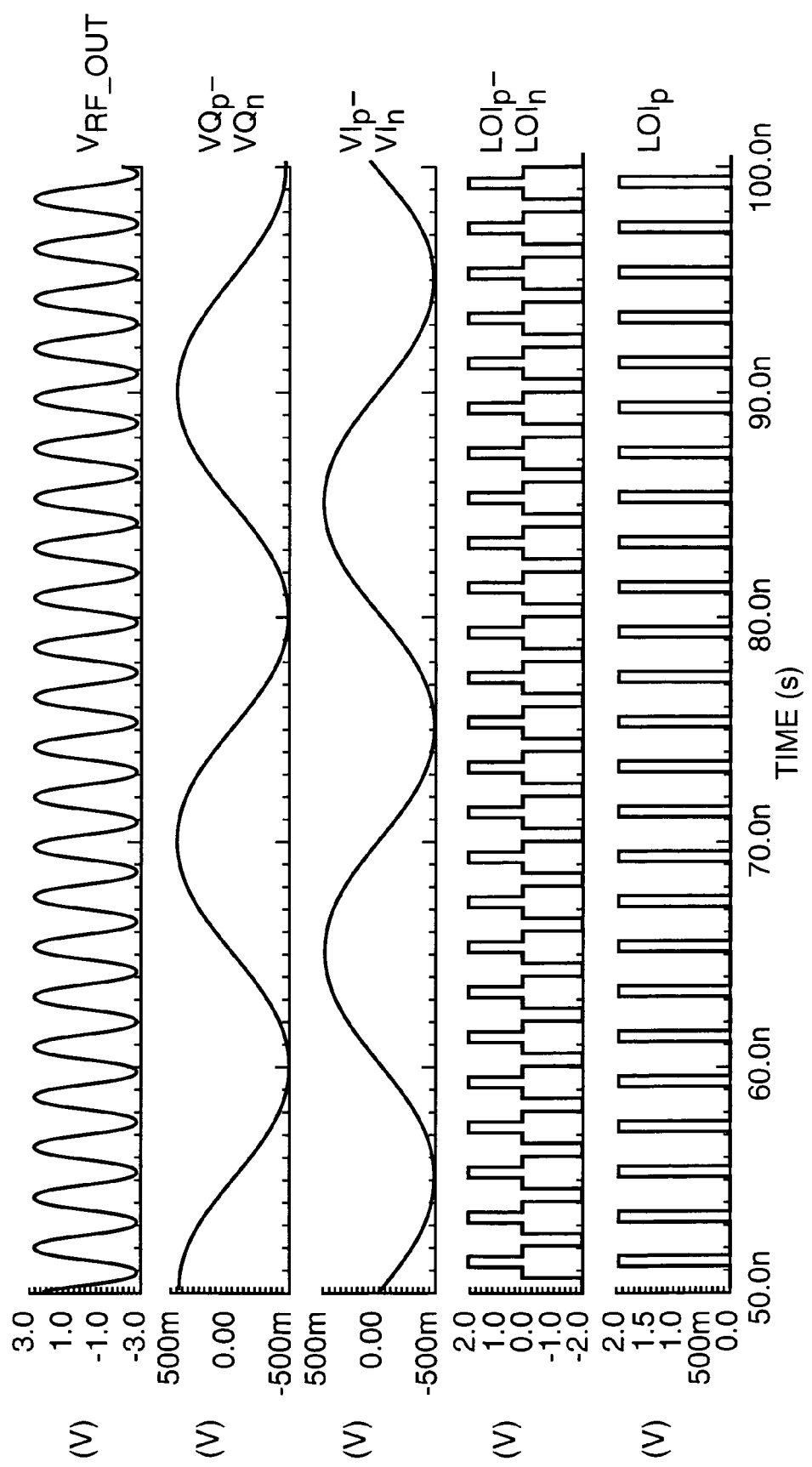
FIG. 3 is a group of waveforms illustrating the local oscillator signals, the baseband information signals and the modulated output signal of FIG. 2, for example.

Advantageously, the local oscillator circuit 12 is configured to provide the local oscillator signals, LOIp/LOIn and LOQp/LOQn, as switching waveforms at the desired frequency and with a duty cycle at or about twenty-five percent. FIG. 3 illustrates one embodiment of local oscillator signal waveforms, and further depicts corresponding baseband information signal and power amplifier output waveforms, for a given configuration of the corresponding modulator circuit 14 and power amplifier circuit 16. Note that it should be understood that the illustrated scale in FIG. 3 is representative rather than limiting.

With that in mind, the bottom-most waveform of FIG. 3 represents the LOIp component of the differential waveform pair, LOIp/LOIn. Its depicted amplitude is 2 Volts peak-to-peak, but it should be understood that the driving amplitude and the relative offset voltages used for the LOI (and LOQ) signals will be a matter of design, and depends on a number of considerations, such as the configuration of the modulator 14, the transistor threshold voltages involved, the power supply and biasing voltages used, the desired operating temperature range, and so on.

In any case, proceeding logically upward in the waveform diagram, the next waveform depicted represents the differential waveform (LOIp−LOIn), and one sees that the twenty-five percent duty cycle generation of LOIp and LOIn produce a differential waveform having a characteristic stepped square wave. For the 2 V pk-pk generation of LOIp and LOIn, the differential component (LOIp−LOIn) will have an effective amplitude of −2 V to 2 V. It should be understood that a similar set of waveform patterns apply to the quadrature baseband signal LOQp/LOQn.

Continuing with the diagram, the next two waveforms depicted represent the differential baseband information signals (VIp−VIn) and (VQp−VQn). Finally, the topmost waveform represents the correspondingly modulated output signal, VRF_OUT, as generated by the power amplifier circuit 16.

With the above details in mind, one may appreciate at least some of the advantages of operating the modulator 14 at or about a twenty-five percent duty cycle, as compared to the conventional operation at or about fifty percent duty cycles. Operating with a twenty-five percent duty cycle, such as represented for one or more embodiments by the twenty-five percent duty cycles of the local oscillator waveforms depicted in FIG. 4, reduces the conversion gain of the modulation circuit 10 by three 3 dB, but doing so also halves the current consumption of the modulator 14 and halves the noise of that circuit. Halving the current consumption reduces the output power by 3 dB, but the corresponding reduction in noise means that the signal-to-noise ratio (SNR) of the mixer output signal remains the same. Alternatively, one could operate the modulator 14 at a twenty-five percent duty cycle but with a current consumption comparable to operation at a fifty percent duty cycle, and thereby improve the output power and SNR by 3 dB.

Figure 4:
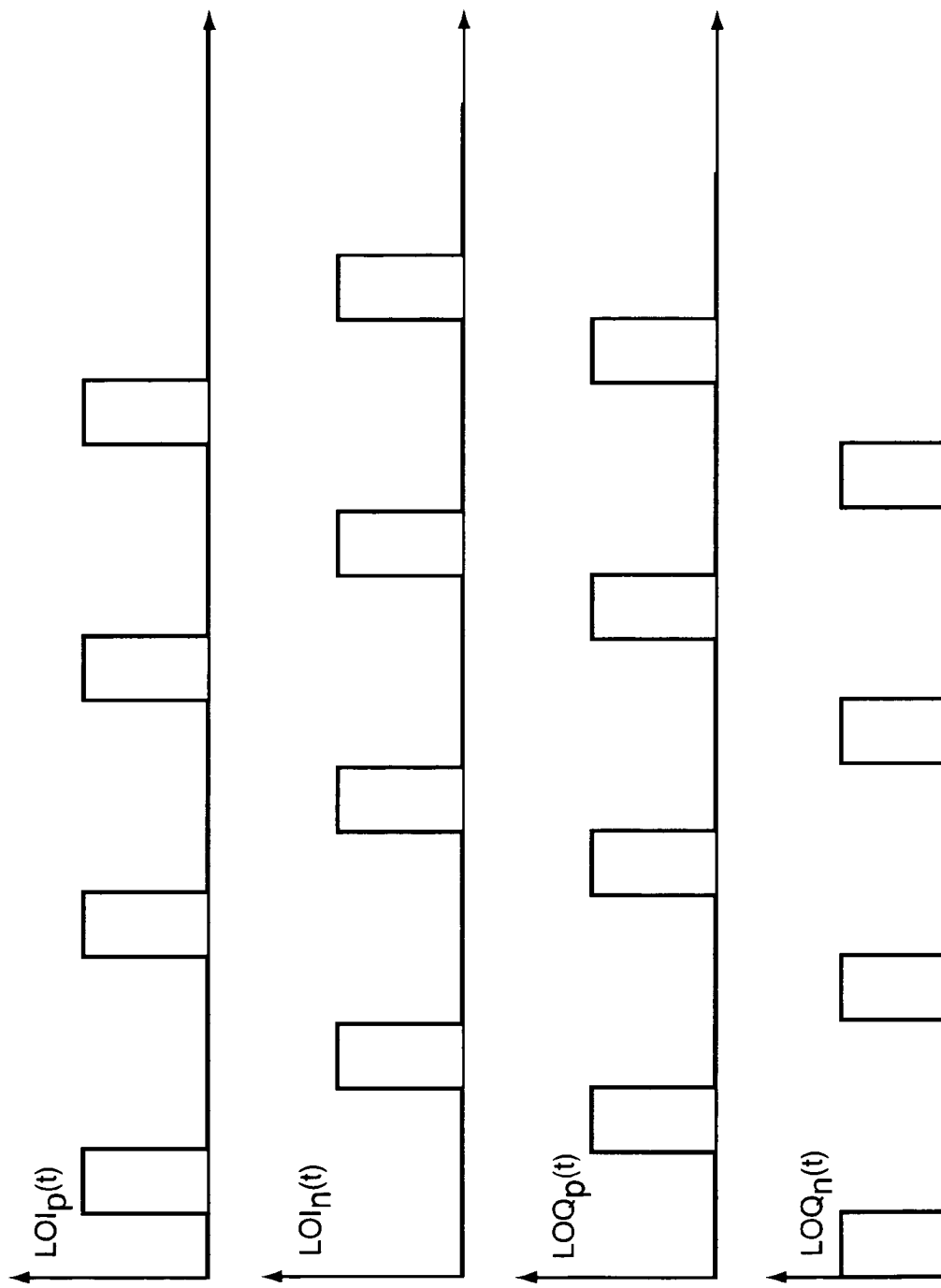
FIG. 4 is a waveform graph illustrating one embodiment of generating local oscillator signals having a twenty-five percent duty cycle.

Understanding the above details begins with a generalized Fourier series representation of the local oscillator signal waveforms depicted in FIG. 4, for example, which is given as $$s(t) = \frac{\tau}{T} + 2\frac{\tau}{T}\sum_{n=1}^{\infty}\frac{\sin(n\omega_{LO}\frac{\tau}{2})}{n\omega_{LO}\frac{\tau}{2}}\cos(n\omega_{LO}t) \quad \text{(Eq. 1)}$$

where $$T = \frac{2\pi}{\omega_{LO}}.$$

Expressing the duty cycle term as $$\eta = \frac{\tau}{T}$$

allows, for example, the LOIp(t) waveform of FIG. 4 to be expressed generally as $$s_p(t) = \eta + 2\sum_{n=1}^{\infty}\frac{\sin(n\pi\eta)}{n\pi}\cos(n\omega_{LO}t) \quad \text{(Eq. 2)}$$

Thus, LOIn(t), being 180 degrees out-of-phase with LOIp(t), can be expressed generally as $$s_n(t) = \eta + 2\sum_{n=1}^{\infty} \frac{\sin(n\pi\eta)}{n\pi} \cos(n\omega_{LO}t + n\pi) \quad \text{(Eq. 3)}$$

The differential signal will then be $$s_{diff}(t) = s_p(t) - s_n(t) = \frac{4}{\pi}\sum_{n=0}^{\infty} \frac{\sin((2n+1)\pi\eta)}{2n+1} \cos((2n+1)\omega_{LO}t) \quad \text{(Eq. 4)}$$

For a fifty percent duty cycle, i.e., $\eta=\frac{1}{2}$, (Eq. 4) yields $$s_{diff}(t) = \frac{4}{\pi}\sum_{n=0}^{\infty} \frac{\sin((2n+1)\pi/2)}{2n+1} \cos((2n+1)\omega_{LO}t) \quad \text{(Eq. 5)}$$

For a twenty-five percent duty cycle, i.e., $\eta=\frac{1}{4}$, (Eq. 4) yields $$s_{diff}(t) = \frac{4}{\pi}\sum_{n=0}^{\infty} \frac{\sin((2n+1)\pi/4)}{2n+1} \cos((2n+1)\omega_{LO}t) \quad \text{(Eq. 6)}$$

With the fifty percent duty cycle term of (Eq. 5) in mind, the current conversion of the modulator 14 (from the differential outputs of the transconductance stage 18 to the load currents Ic1 and Ic2) can be derived as $$I_{out} = \frac{I_{c1} - I_{c2}}{2} = I_{in,diff} \frac{2}{\pi}\sum_{n=0}^{\infty} \frac{\sin((2n+1)\pi/2)}{2n+1} \cos((2n+1)\omega_{LO}t) \quad \text{(Eq. 7)}$$

Where, $I_{in,diff}$ is the differential current input to the mixer stage 20, which is the same as the differential output current of the transconductance stage 18.

Now, for the twenty-five percent duty cycle term of (Eq. 6) in mind, the output current is $$I_{out} = \frac{I_{c1} - I_{c2}}{2} = I_{in,diff} \frac{2}{\pi}\sum_{n=0}^{\infty} \frac{\sin((2n+1)\pi/4)}{2n+1} \cos((2n+1)\omega_{LO}t) \quad \text{(Eq. 8)}$$

Assuming that the mixer load circuit 22 is resonant at the local oscillator frequency, $f_{LO}$, the amplitude of the fundamental tone (n=0) in the load current is $$I_{in,diff} \frac{\sqrt{2}}{\pi}$$

for twenty-five percent duty cycle operation. In comparison, the amplitude of the fundamental tone (n=0) in the load current of (Eq. 7), which, assuming the conventional use of fifty percent duty cycles in the local oscillator signals, is $$I_{in,diff} \frac{2}{\pi}.$$

With these expressions in mind, one sees that the modulator 14 can be operated at a twenty-five percent duty cycle with a 3 dB reduction in power but no degradation in SNR because of the corresponding reduction in current and noise

Figure 5:
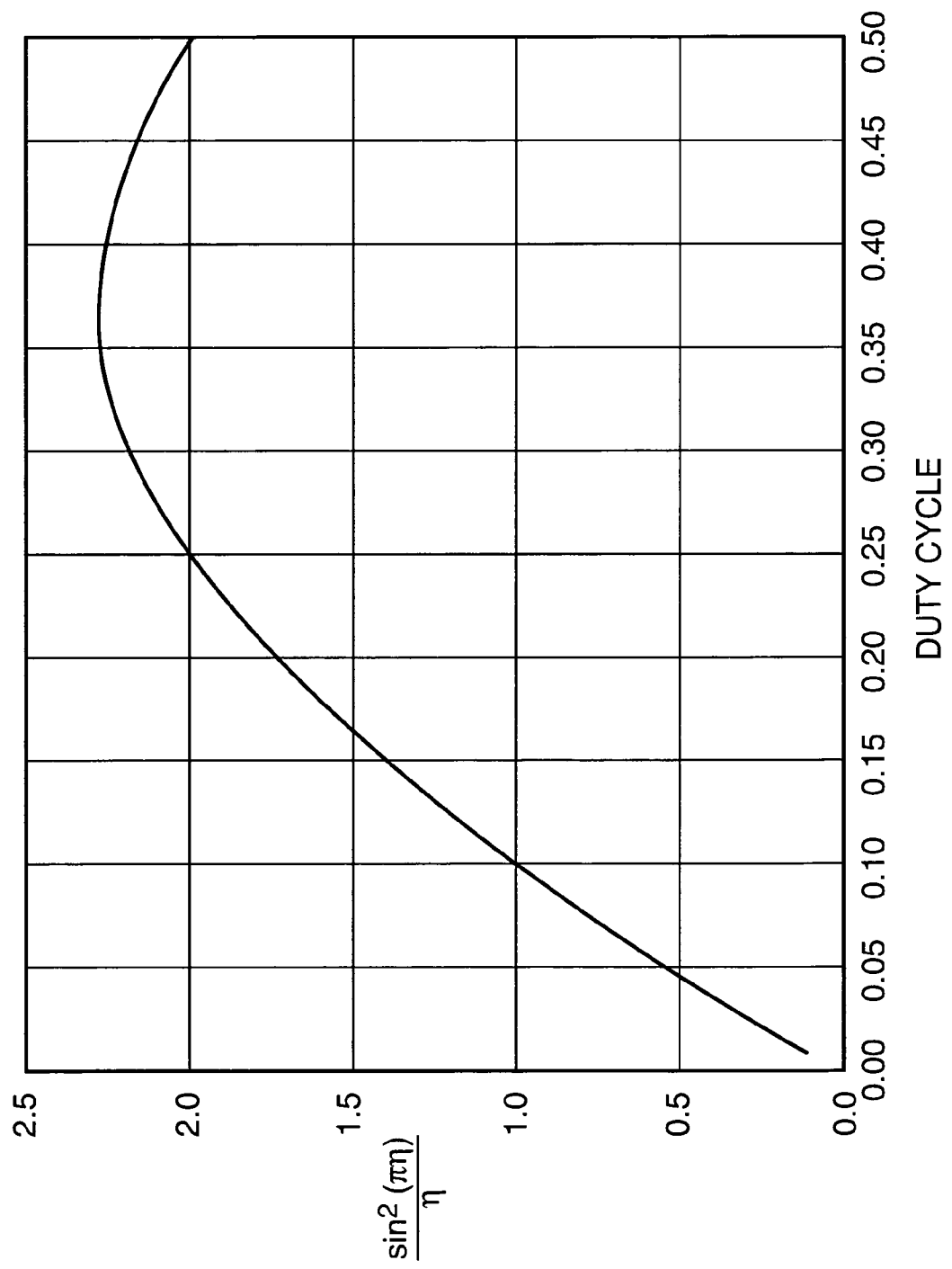
FIG. 5 is a graph relating local oscillator signal duty cycle to signal-to-noise-ratio.

FIG. 5 plots $$\frac{\sin^2(\pi\eta)}{\eta}$$

as a function of duty cycle $\eta$ and further illustrates one or more of the advantages of operating the modulator 14 at a twenty-five percent duty cycle. More particularly, from the fundamental tone of (Eq. 4), one sees that the output power of the modulator is proportional to $\sin^2(\pi\eta)$, wherein, in turn, $$\frac{\sin^2(\pi\eta)}{\eta}$$

is proportional to SNR. Note, too, that the noise power is directly dependent on the duty cycle $\eta$. Further, one sees that the plotted ratio is maximized at approximately 0.37. However, a duty cycle ratio of 0.37 is impractical, or at least decidedly more complex to generate than a duty cycle of 0.25. Indeed, a duty cycle of 0.25 can be reliably and cleanly generated by the local oscillator circuit 12 from an input clock signal of the desired frequency, or at some multiple thereof, using flip-flops and digital delay gates, for example. Further, one may use a Johnson-counter, a quadrature Voltage Controlled Oscillator (VCO), or a divide-by-2 circuit in combination with supporting logic.

Regardless of the generation details embodied in the local oscillator circuit 12, one sees that the plotted ratio has the same value at a duty cycle of 0.25 as it does at the conventionally used duty cycle of 0.5. This constancy in SNR as compared to conventional operation at fifty percent duty cycles arises because the modulator's transconductance current sources are on for half as much time and the total noise power transferred to the mixer circuit load 22 is therefore halved. sources are on for half as much time and the total noise power transferred to the mixer circuit load 22 is therefore halved.

Figure 6:
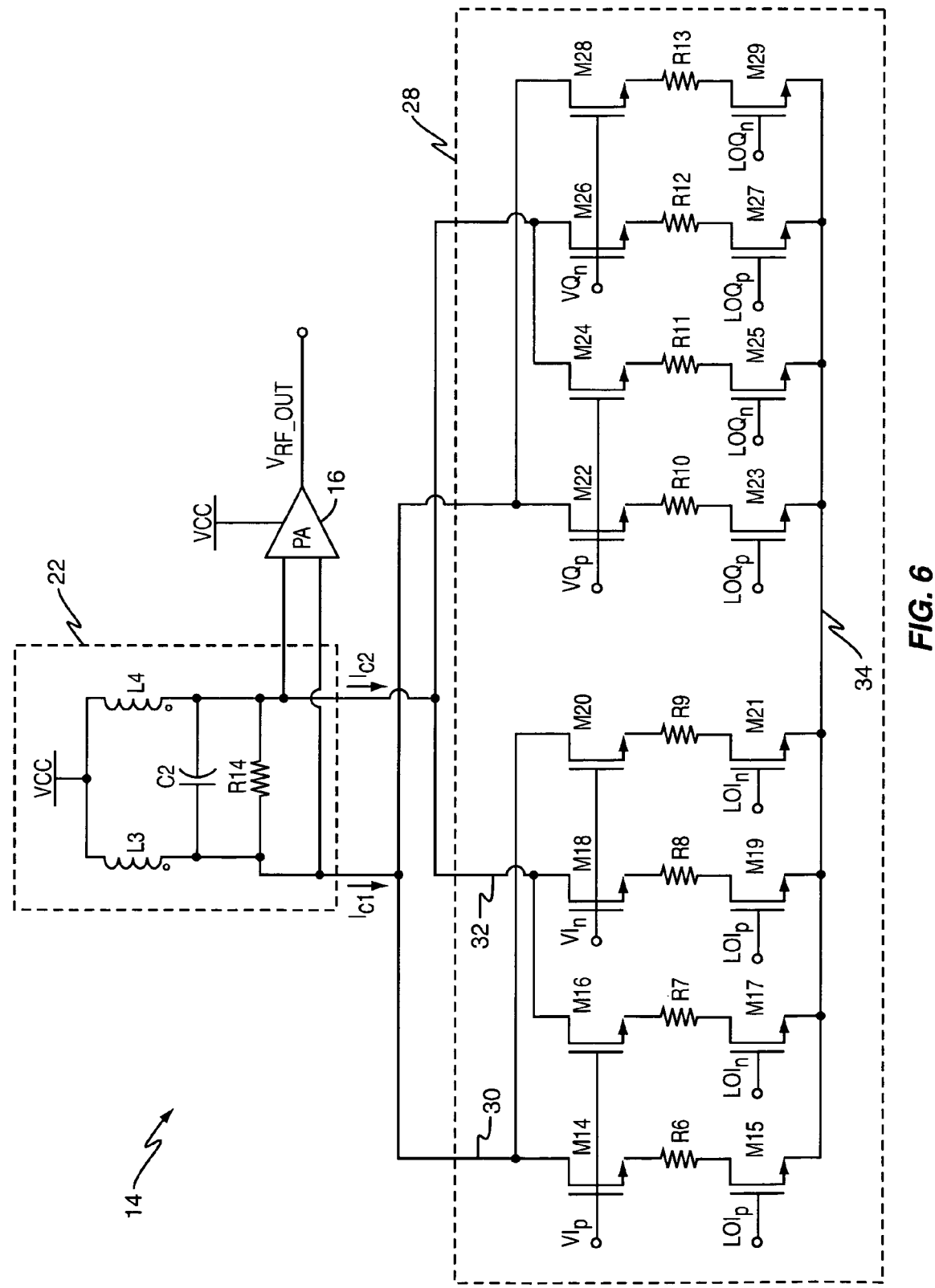
FIG. 6 is a schematic diagram of another embodiment of the modulator illustrated in the modulation circuit of FIG. 1.

The same or similar twenty-five percent duty cycle signals may be applied to the embodiment of modulator 14 depicted in FIG. 6, and it should be understood that this embodiment of the modulator 14 can be substituted into the modulation circuit 10 of FIG. 1. Of course, it should be further understood that the modulator 14 depicted in FIG. 6 has advantages over the embodiment of modulator 14 as depicted in FIG. 2 that are not dependent on providing it with local oscillator signals having a twenty-five percent duty cycle. However, it does offer excellent performance when used in that context.

In more detail, the modulator 14 depicted in FIG. 6 includes a combined mixer and transconductance stage circuit 28 that provides, among other things, improved output voltage swing capability of the modulator 14. Increased output voltage swing increases the output power of the modulator 14 for the same input power—i.e., improves its efficiency.

One notable feature of the combined mixer and transconductance stage 28 depicted in FIG. 6 is that the switching transistors driven by the local oscillator signals are moved to the bottom of the transconductance transistors driven by the baseband information signals. More particularly, the combined mixer and transconductance stage 28 includes a transistor circuit for each baseband information signal serving as a modulation input to the modulator 14. Each transistor circuit comprises a first transistor driven by the baseband information signal and coupling a modulator output node to a corresponding transconductance element, and a second transistor driven by one of the one or more local oscillator signals and coupling the corresponding transconductance element to a signal ground node.

This arrangement is plainly seen, for example, wherein the transistor M14 represents the first transistor of one of the transistor circuits, the resistor R6 represents the corresponding transconductance element, and the transistor M15 represents the second transistor of the same transistor circuit. Further, one sees that transistor M14 is driven by one of the baseband information signals—depicted as the positive component of the differential baseband signal pair VIp and VIn—and that transistor M14 couples one of the modulator output nodes 30 and 32 to one end of the transconductance element R6. The other end of R6 is coupled to a signal ground or reference node 34 through transistor M15, which is driven by one of the local oscillator signals—depicted as the positive component of the differential local oscillator signal pair LOIp and LOIn. Similar operation is provided by the transconductance transistors M16-M28 (even), and their corresponding transconductance elements R7-R13 and switching transistors M15-M29 (odd). Note, too, that the switching transistors M15-M29 (odd) can be placed on the drains or gates of the transconductance transistors M14-M28 (even).

In any case, for differential signal configurations, the combined mixing and transconductance circuit 28 generally includes a pair of the illustrated transistor circuits for each differential signal in the differential signal pair. While this configuration effectively doubles the number of current sources as compared to the transconductance stage circuit 18 illustrated for the modulator embodiment of FIG. 2, the relative current levels are halved and SNR is thus maintained. Further, as noted above, the illustrated circuit arrangement provides improved output voltage swing. More particularly, one sees that in, FIG. 2, the switching transistors—the transistors driven by the local oscillator signals—appear between the mixer load and the transconductance transistors—the transistors driven by the baseband information signals. That circuit arrangement means that the switching transistors, i.e., transistors M2, M3, M5, M6, M8, M9, M11, and M12 of FIG. 2, consume a few hundred millivolts of output voltage headroom. In contrast, the switching transistors M15-M29 (odd) in FIG. 6 are included below the transconductance elements (resistors R6-R13) and, thus, are effectively subsumed in those resistances.

Figure 7:
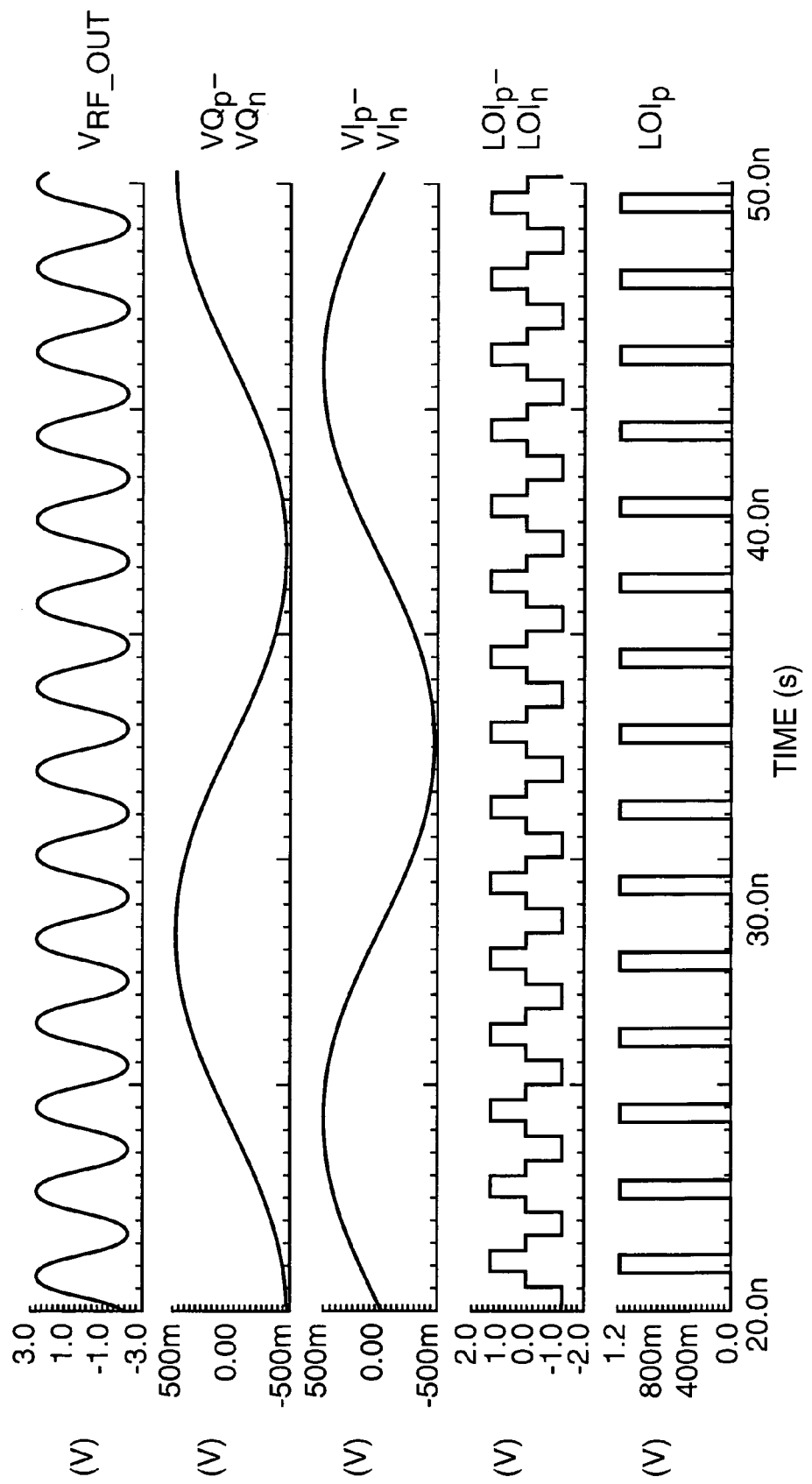
FIG. 7 is a group of waveforms illustrating the local oscillator signals, the baseband information signals and the modulated output signal of FIG. 6, for example.

FIG. 7 illustrates one embodiment of local oscillator and baseband signal waveforms that may be used with the modulator 14 of FIG. 6. As with the waveforms in FIG. 3, FIG. 7 illustrates in bottom-up order, the LOIp signal, the LOIp–LOIn differential signal, the VIp–Vin differential signal, the VQp–VQn differential signal, and the VRF_OUT signal. Of course, those skilled in the art will appreciate that the illustrated signal levels are provided only by way of non-limiting example.

However, it should be noted that positioning the switching transistors M15-M29 (odd) at the bottom of the transconductance transistors M14-M28 (even) offers, among other things, the advantage of using-reduced amplitudes for the local oscillator signals. To understand this, one may refer to the switching transistors of FIG. 2, which are shown in the mixer stage circuit 20 as transistors M2/M3, M5/M6, M8/M9, and M11/M12. The drive voltages applied to the gates of those transistors must exceed the gate-to-source threshold voltage by a sufficient margin to insure full turn-on of the transistors. Because the gate-to-source voltage of those transistors is referenced to the voltage appearing on respective source nodes of the transconductance stage 18, the applied drive voltages of LOIp/LOIn and LOQp/LOQn must be higher than the applied drive voltages for the combined mixer and transconductance stage circuit 28 of FIG. 6. That is, the gate-to-source voltage of the switching transistors M15-M29 (odd) in FIG. 6 is referenced to a common signal ground node 34, meaning that these transistors can be fully turned on using a comparatively lower amplitude for the local oscillator signals, independent of duty cycle.

Figure 8:
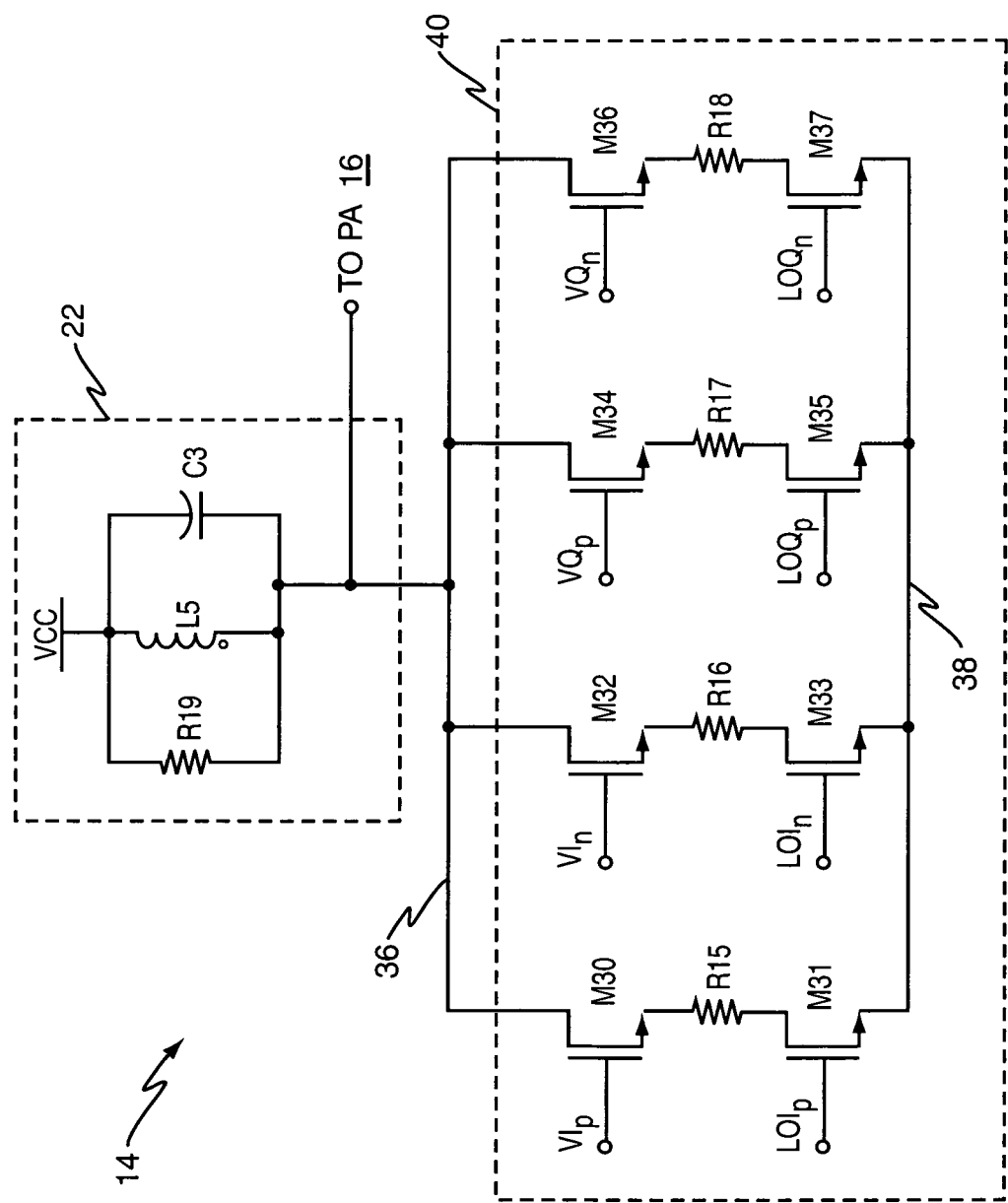
FIG. 8 is a schematic diagram of another embodiment of the modulator illustrated in the modulation circuit of FIG. 1.

With these and other advantages in mind, FIG. 8 illustrates another embodiment of the modulator 14, wherein a combined mixer and transconductance stage circuit 40 is configured for singled-ended operation. Here, a first transistor circuit comprises a first transistor M30, which couples a common modulator output node 36 to a corresponding transconductance element R15. In turn, that transconductance element is coupled to a common signal reference node 38 through a second transistor M31. The transistor M30 is driven by one component of the differential baseband information signal pair VIp/VIn, and the transistor M31 is driven by one component of the differential local oscillator signal pair LOIp/LOIn. Transistors M32/M33, M34/M35, M36/M37, and their corresponding transconductance elements R16, R17, and R18, provide similar functionality for the remaining components of the differential signals VIp/VIn, VQp/VQn, LOIp/LOIn, and LOQp/LOQn.

The mixer load circuit 22 complements the single-ended configuration of the combined mixer and transconductance stage circuit 40 by providing a single-ended connection between a supply voltage (VCC) and the common modulator output node 36. While it should be understood that the mixer load circuit 22 can be configured differently, the illustrated embodiment comprises a parallel RLC circuit that includes C3, L5, and R19.

Figure 9:
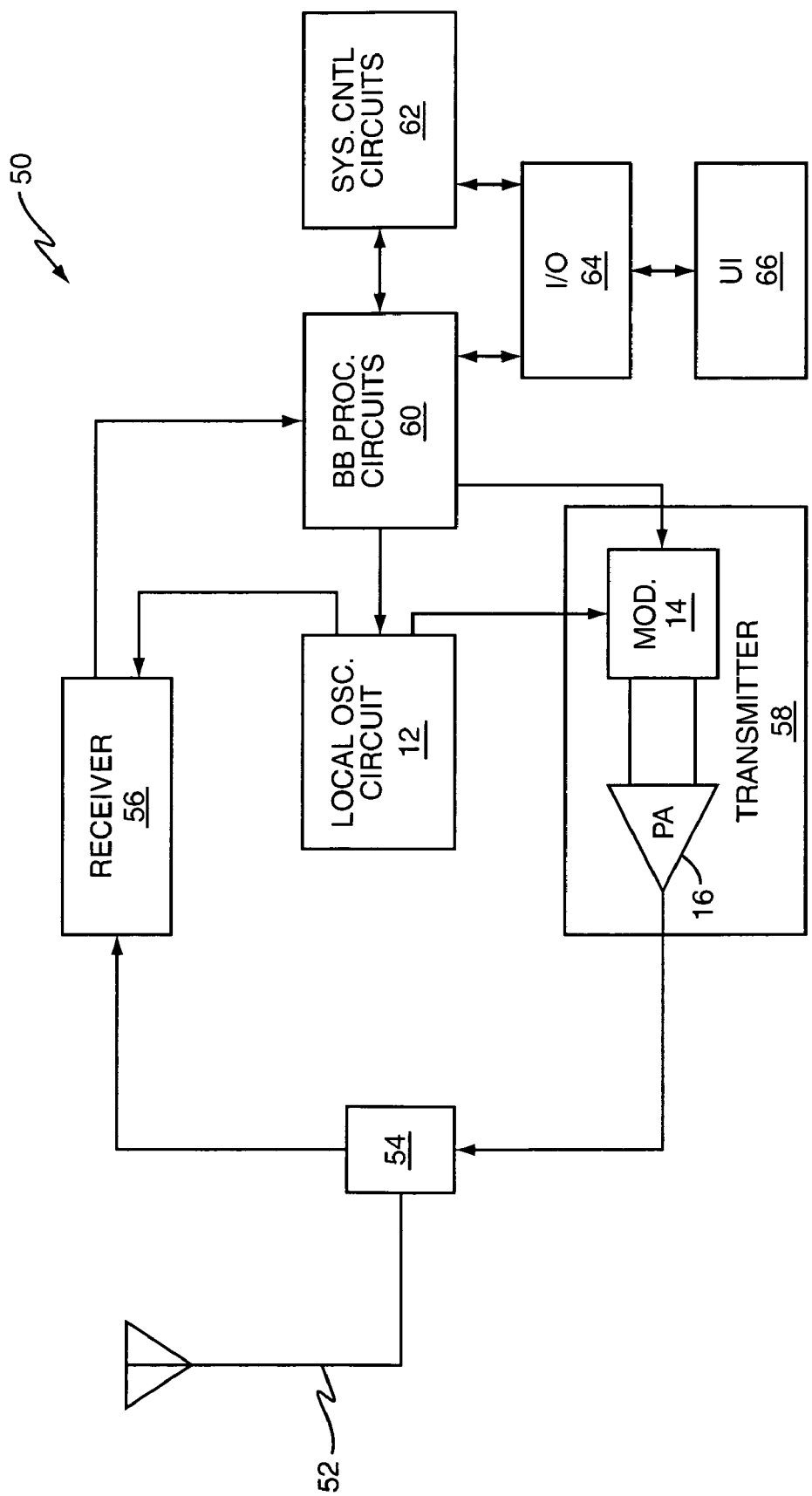
FIG. 9 is a block diagram of one embodiment of a wireless communication device that includes an embodiment of the modulation circuit of FIG. 1.

It also should be understood that the modulation circuit 10 can be used in a variety of applications involving the generation and transmission of modulated signals, such as in the types of radiofrequency transceivers used in wireless communication base stations and mobile stations. For example, FIG. 9 illustrates one embodiment of a wireless communication device 50 that includes an embodiment of the modulation circuit 10 described herein. Note, however, that various elements of the modulation circuit 10 may be distributed within the communication device 50, rather than being wholly integrated together.

In the illustrated embodiment, the wireless communication device 50, which may be, for example, a cellular radiotelephone, PDA, wireless pager, etc., comprises a transmit/receive antenna 52, a switch/duplexer 54, a receiver 56, a transmitter 58, baseband processing circuits 60, system control circuits 62, input/output (interface) circuits 64, and user interface circuits 66. As will be understood, the user interface circuits 66 will vary according to the intended function of the device 50, and thus may include a display screen, keypad, microphone, and a speaker.

Regardless, the baseband processing circuits 60, which may comprise one or more general or special-purpose microprocessors and corresponding program instructions, may be configured to generate baseband information signals—e.g., quadrature signals—for input to the modulator 14 of the transmitter 58. In turn, the local oscillator circuit 12, which may operate under command/control by the baseband processing circuits 60, can be configured to generate local oscillator signals for input to the modulator 14, which thus provides the power amplifier circuit 16 of the transmitter 58 with one or more carrier signals for transmission that are modulated in accordance with the baseband information signals.

With the above range of applications and embodiments in mind, it should be understood that the present invention is not limited by the foregoing description, nor is it limited by the accompanying drawings. Instead, the present invention is limited only by the following claims, and their legal equivalents.

What is claimed is:

1. A modulation circuit for use in a radio frequency transmitter, said modulation circuit comprising:
    a local oscillator circuit configured to generate local oscillator signals; and
    a modulator having modulation signal inputs to receive base-band information signals and local oscillator inputs to receive the local oscillator signals, the modulator comprising a combined mixing and transconductance circuit that includes
        switching transistors having gates coupled to the local oscillator inputs and
        transconductance transistors having gates coupled to the modulation signal inputs to receive the base-band information signals;
    wherein:
        each switching transistor is coupled to the bottom of each transconductance transistor through a transconductance element and directly coupled to ground;
        outputs of the transconductance transistors are combined to generate a modulated signal; and
        the local oscillator is configured to drive the gates of the switching transistors at a duty cycle at or about twenty-five percent.

2. The modulation circuit of claim 1, wherein modulation signal inputs are configured to receive differential pairs of in-phase and quadrature phase base-band information signals and the local oscillator inputs are configured to receive differential pairs of in-phase and quadrature phase local oscillator signals.

3. The modulation circuit of claim 2, wherein the combined mixing and transconductance circuit comprises four pairs of transconductance transistors to receive the differential pairs of in-phase and quadrature phase base-band information signals, each transconductance transistor of the four pairs connected in series with a transconductance element, and four pairs of switching transistors driven by the differential pairs of in-phase and quadrature phase local oscillator signals; wherein outputs of the four pairs of transconductance transistors are combined to generate a differential modulated signal.

4. The modulation circuit of claim 2, wherein the combined mixing and transconductance circuit comprises four transconductance transistors, each of the four transconductance transistors connected in series with a transconductance element; and four switching transistors; wherein outputs of the four transconductance transistors are combined to generate a single-ended modulated signal.

5. A wireless communication device including a modulation circuit, said modulation circuit comprising:
    a local oscillator circuit configured to generate local oscillator signals; and
    a modulator having modulation signal inputs to receive base-band information signals and local oscillator inputs to receive the local oscillator signals, the modulator comprising a combined mixing and transconductance circuit that includes
        switching transistors having gates coupled to the local oscillator inputs and
        transconductance transistors having gates coupled to the modulation signal inputs to receive the base-band information signals;
    wherein:
        each switching transistor is coupled to the bottom of each transconductance transistor through a transconductance element and directly coupled to ground;
        outputs of the transconductance transistors are combined to generate a modulated signal; and
        the local oscillator is configured to drive the gates of the switching transistors at a duty cycle at or about twenty-five percent.

* * * * *

UNITED STATES PATENT AND TRADEMARK OFFICE
CERTIFICATE OF CORRECTION

PATENT NO. : 7,904,036 B2  
APPLICATION NO. : 11/292488  
DATED : March 8, 2011  
INVENTOR(S) : Mattisson et al.

Page 1 of 1

It is certified that error appears in the above-identified patent and that said Letters Patent is hereby corrected as shown below:

In Column 2, Line 23, delete "example," and insert -- example. --, therefor.

In Column 6, Line 8, delete "noise" and insert -- noise. --, therefor.

In Column 7, Line 58, delete "VIp-Vin" and insert -- VIp-VIn --, therefor.

Signed and Sealed this  
Nineteenth Day of July, 2011

David J. Kappos  
*Director of the United States Patent and Trademark Office*